(12) United States Patent
Igarashi

(10) Patent No.: US 6,828,189 B2
(45) Date of Patent: Dec. 7, 2004

(54) SEMICONDUCTOR DEVICE AND METHOD OF FABRICATING THE SAME

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/106,100

(22) Filed: Mar. 27, 2002

(65) Prior Publication Data

US 2003/0060007 A1 Mar. 27, 2003

(30) Foreign Application Priority Data

Sep. 27, 2001 (JP) ........................................ 2001-297956

(51) Int. Cl.⁷ .......................................... H01L 21/8242
(52) U.S. Cl. ...................................... 438/239; 257/295
(58) Field of Search ............................ 438/3, 239, 250, 438/253, 393, 396; 257/295, 303, 306, 310

(56) References Cited

U.S. PATENT DOCUMENTS

| | | | | |
|---|---|---|---|---|
| 5,923,970 A | * | 7/1999 | Kirlin | 438/240 |
| 6,225,156 B1 | * | 5/2001 | Cuchiaro et al. | 438/240 |
| 6,246,082 B1 | * | 6/2001 | Mitarai et al. | 257/295 |
| 6,455,327 B1 | * | 9/2002 | Maejima | 438/3 |
| 6,509,601 B1 | * | 1/2003 | Lee et al. | 257/310 |
| 2002/0127867 A1 | * | 9/2002 | Lee | 438/694 |

FOREIGN PATENT DOCUMENTS

| | | |
|---|---|---|
| JP | 04-102367 | 11/1992 |
| JP | 9-331031 | 12/1997 |
| JP | 2001 36026 | 2/2001 |
| JP | 2001 244263 | 9/2001 |

* cited by examiner

*Primary Examiner*—David Nelms
*Assistant Examiner*—David Vu
(74) *Attorney, Agent, or Firm*—Rabin & Berdo, P.C.

(57) ABSTRACT

A semiconductor device and a fabricating method thereof, capable of suppressing diffusion of hydrogen into a device and also capable of maintaining high performance are provided, while a passivation film is formed in a device whose performance is easily deteriorated by hydrogen diffusions. The semiconductor device is comprised of: a semiconductor substrate; a ferroelectric capacitor formed on the semiconductor substrate; a first interlayer film containing the ferroelectric capacitor; and a passivation film formed on the first interlayer film; in which a hydrogen diffusion preventing film is formed under the passivation film, and substantially adjacent to this passivation film. Also, the method for fabricating the semiconductor device is comprised of at least a step for forming a hydrogen diffusion preventing film under a passivation film and also substantially adjacent to this passivation film.

18 Claims, 8 Drawing Sheets

SEMICONDUCTOR DEVICE AND METHOD OF FABRICATING THE SAME

BACKGROUND OF THE INVENTION

1. Field of the Invention

The present invention is generally related to a semiconductor device. More specifically, the present invention is directed to a semiconductor device and a method for fabricating such a semiconductor device in which a passivation film is formed with employment of both a high-K dielectric substance and a ferroelectric substance.

2. Description of the Prior Art

Recently, in order to obtain high-K dielectric constants, or utilize spontaneous polarization, high-K dielectric substances and ferroelectric substances, which are made of metal oxides, are employed as capacitors for semiconductor memory devices.

These semiconductor devices with employment of the above-explained high-K dielectric substances and ferroelectric substances are required to be operable under stable conditions in any kinds of environments of usage. To this end, in particular, moisture contained in air must be kept out. As a consequence, a passivation film is formed on a surface of such a semiconductor device so as to avoid penetration of moisture. As this passivation film, a silicon nitride ($Si_3N_4$) film has been widely utilized. This silicon nitride film is formed by that while a P-CVD (Plasma assisted Chemical Vapor Deposition) method is employed, material gas containing $SiH_4$ is decomposed. As a result, the semiconductor device is exposed in hydrogen atmosphere during the film forming process. Furthermore, since the silicon nitride film deposited by this P-CVD method contains high concentration of hydrogen, hydrogen contained in this film may be sometimes diffused after the silicon nitride film has been formed.

When high-K dielectric substances and ferroelectric substances are reduced by hydrogen, characteristics thereof may be considerably deteriorated. As a result, there is such a problem that the passivation films similar to the conventional semiconductor devices are problematic to form in such semiconductor devices using high-K dielectric substances and ferroelectric substances.

SUMMARY OF THE INVENTION

The present invention has been made to solve the above-described problems, and therefore, has an object to provide a semiconductor device, and a fabricating method thereof, capable of suppressing diffusion of hydrogen in and also capable of maintaining high performance even when a passivation film is formed in such a device.

As a result of enthusiastic research in order to solve the above-described problems, Inventors of the present invention could find out the solutions capable of solving the above-explained problems. That is:

<1> A semiconductor device, according to an aspect of the present invention, is featured by such a semiconductor device comprising: a semiconductor substrate; a ferroelectric capacitor formed on the semiconductor substrate; a first interlayer film covering the ferroelectric capacitor; a passivation film formed on the first interlayer film; and a hydrogen diffusion preventing film formed between the passivation film and the first interlayer film.

<2> Also, the present invention is featured by that in the semiconductor device recited in the item <1>, at least one other interlayer film is formed between the first interlayer film and the passivation film.

<3> Also, the present invention is featured by that in the semiconductor device recited in the item <1>, or the item <2>, the hydrogen diffusion preventing film is made of a tantalum oxide under amorphous state, or under microcrystalline state.

<4> Also, the present invention is featured by that in the semiconductor device recited in any one of the items <1> to <3>, the hydrogen diffusion preventing film is patterned.

<5> Also, the present invention is featured by that in the semiconductor device recited in any one of the items <1> to <4>, the hydrogen diffusion preventing film is formed in a non-reducing atmosphere.

<6> A method for fabricating the semiconductor device recited in the items <1> to <5> of the present invention, is featured by comprising at least a step for forming a hydrogen diffusion preventing film under a passivation film and also substantially adjacent to the passivation film.

DETAILED DESCRIPTION OF THE PREFERRED EMBODIMENT

Referring now to drawings, preferred embodiments of the present invention will now be explained in detail.

A semiconductor device of the present invention is comprised of: a semiconductor substrate; a ferroelectric capacitor formed on the semiconductor substrate; a first interlayer film containing the ferroelectric capacitor; and a passivation film which is formed on the first interlayer film. In this semiconductor device, a hydrogen diffusion preventing film is formed under the passivation film and substantially adjacent to this passivation film.

Referring now to FIG. 1 to FIG. 8, the semiconductor device of the present invention will be described in detail.

Figure 1:
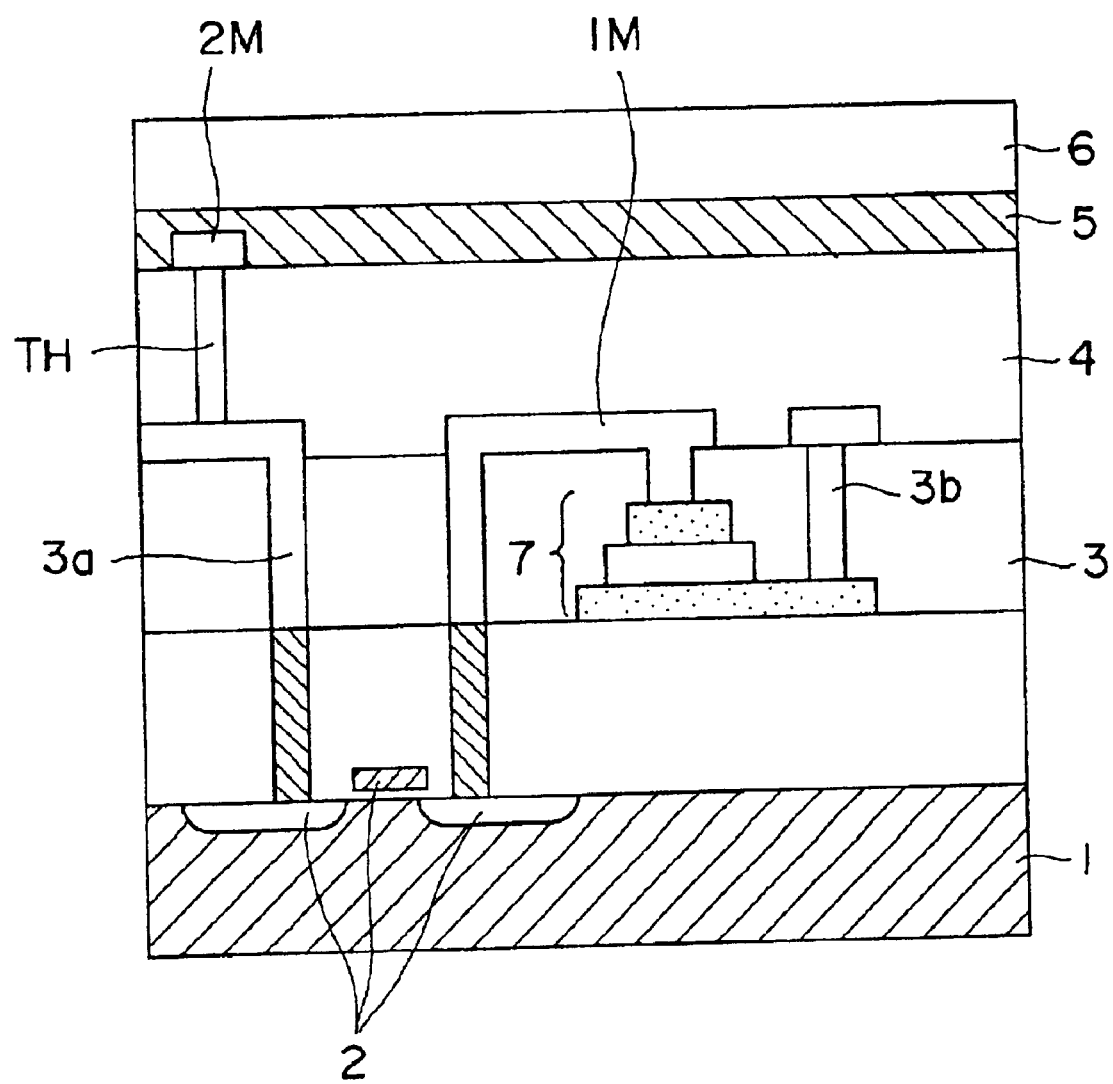
FIG. 1 is a diagram for schematically showing a structure of a semiconductor device according to the present invention.

A semiconductor device shown in FIG. 1 is constructed as follows: That is, when a passivation film 6 is formed after both a metal wiring 1M and another metal wiring 2M have been formed, a hydrogen diffusion preventing film 5 is formed substantially adjacent to this passivation film 6 as an underlayer film of the passivation film 6.

In other words, both a transistor 2 and a ferroelectric capacitor 7 are formed on a semiconductor substrate 1 made of Si, and an $SiO_2$ film is formed as a first interlayer film 3 by a CVD (chemical vapor deposition) method. After moisture contained in the $SiO_2$ film has been removed by a thermal processing, both contact holes 3a and 3b are formed so as to accomplish connections to both the transistor 2 and the ferroelectric capacitor 7. After this metal wiring 1M used for both the transistor 2 and the ferroelectric capacitor 7 has been formed by a sputtering method, this wiring 1M is etched to form a desirable wiring pattern. An $SiO_2$ film is formed as a second interlayer film 4 by the CVD method, and then, a contact hole TH is formed on the metal wiring 1M in order that a peripheral circuit is connected to a ferroelectric memory cell. After another metal wiring 2M has been formed by the sputtering method, a hydrogen diffusion preventing film 5 is formed. Finally, a passivation film 6 is formed as a protection film.

In this case, the above expression "hydrogen diffusion preventing film is formed under and also substantially adjacent to passivation film" implies such a region located just under the passivation film 6, or another region between the uppermost layer (namely, layer having metal wiring 2M in example of FIG. 1) and the passivation film 6, for example, under a planar layer (not shown) located just under the passivation film 6.

It should be noted that as indicated in FIG. 1, at least one, or more interlayer films are preferably formed on the above-explained first interlayer film 3. In this case, the passivation film 6 is preferably formed on the above-described interlayer film of the uppermost layer (namely, second interlayer film 4 in case of FIG. 1).

As shown in FIG. 1, a hydrogen diffusion preventing film 5 is disposed just under the passivation film 6 which may diffuse hydrogen (a hydrogen diffusion source). This structure, in which the hydrogen diffusion preventing film 5 is disposed on the metal wiring of the uppermost layer (the second metal layer 2M in this embodiment), allows for thermal processing for recovering the characteristics of the ferroelectric capacitor film 7 to be conducted at a sufficiently high temperature. This thermal processing may be conducted simultaneously with formation of the first interlayer film. Consequently, a crystalline structure of the hydrogen diffusion preventing film 5, described below, will not be changed by the thermal processing. Thus, the film 5 can effectively prevent hydrogen diffusion from the passivation film 6, provided there is no other hydrogen diffusion source above the capacitor and below the hydrogen diffusion preventing film 5, and accordingly, recovery of the ferroelectric capacitor film 7 can be adequately achieved.

Further, if the hydrogen diffusion preventing film 5 is made from a material which can keep its hydrogen diffusion preventing ability even after experiencing high temperature thermal processing, the hydrogen diffusion preventing film 5 may be disposed on the metal wiring directly connected to one of electrodes of the ferroelectric capacitor 7. That is, the hydrogen diffusion preventing film 5 may be disposed on the first metal wiring 1M in the present embodiment. By employing this structure, hydrogen diffusion from a hydrogen generating source or hydrogen diffusion source that is disposed under the passivation layer 6 and over the first metal wiring 1M and affects the ferroelectric capacitor 7 can be effectively prevented or minimized.

Figure 2:
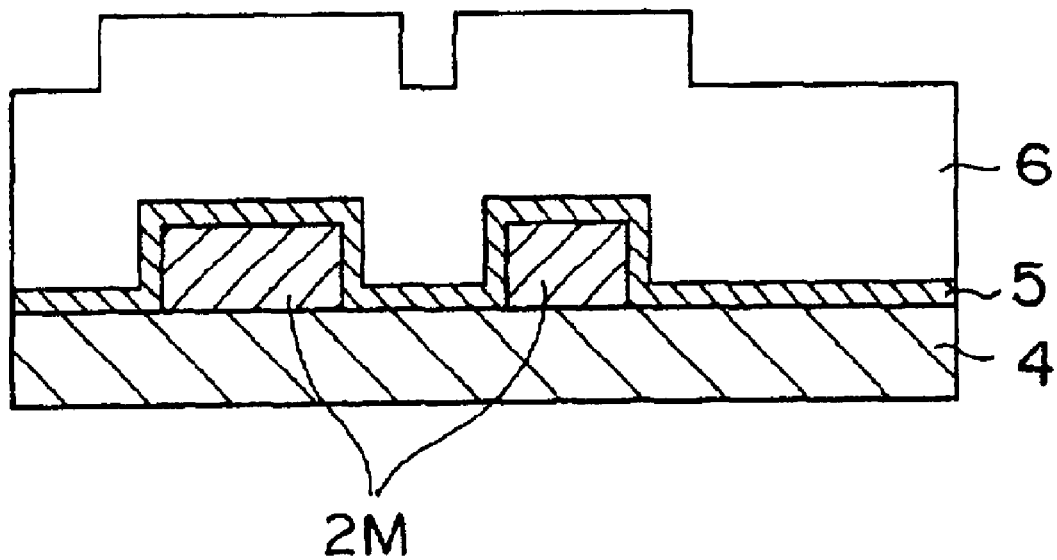
FIG. 2 is a diagram for schematically indicating an upper structure of the semiconductor device according to a first example of the present invention.

FIG. 2 is a sectional view of a semiconductor device for indicating a first example of the present invention. FIG. 2 indicates such a construction defined from the metal wiring 2M of the uppermost layer up to the passivation film 6 in the semiconductor device of FIG. 1. This metal wiring 2M corresponds to the uppermost layer containing the metal wiring. Since a construction of lower layers lower than the metal wiring 2M of the uppermost layer may be made of the structure known in the prior art, explanations thereof are omitted.

The hydrogen diffusion preventing film 5 is formed on the metal wiring 2M of the uppermost layer, and furthermore, the passivation film 6 made of, for example, silicon nitride is formed on this hydrogen diffusion preventing film 5.

The structural composition of the hydrogen diffusion preventing film 5 may be made under amorphous condition, or may be made under such a condition that grain boundaries are wholly distributed, or diffused.

As a material of the hydrogen diffusion preventing film 5, a tantalum oxide ($Ta_2O_5$), alumina ($Al_2O_3$), and the like may be preferably employed. The tantalum oxide may be further preferably employed as this material.

The semiconductor device indicated in FIG. 2 may be preferably manufactured in accordance with the below-mentioned fabricating method.

Figure 3A:
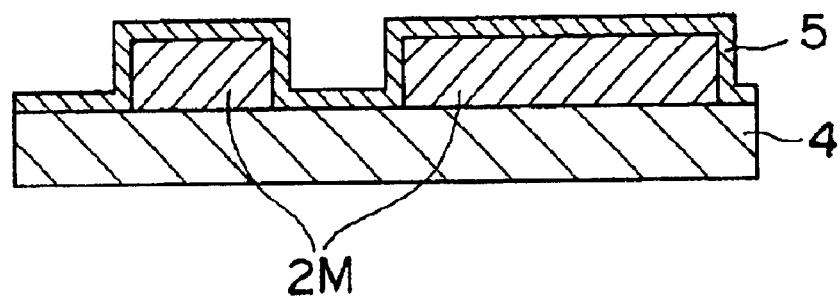
FIG. 3A to FIG. 3C are diagrams for schematically representing a method of fabricating the semiconductor device according to the first example of the present invention.

First, as shown in FIG. 3A, after the metal wiring layer 2M of the uppermost layer in the semiconductor device has been formed, the hydrogen diffusion preventing film 5 is formed (step for forming hydrogen diffusion preventing film). The thickness of the hydrogen diffusion preventing film 5 is set such that an $H_2$-atmosphere which is used when the passivation film 6 is formed in a later fabricating step, and/or $H_2$-gas which is diffused from the formed passivation film 6 by performing a thermal processing does not reach inside the semiconductor device. The optimum film thicknesses are different from each other, depending upon the film quality of the hydrogen diffusion preventing film 5, the film forming condition of the passivation film 6, and the thermal processing step after the film formation, so that these optimum film thickness cannot be defined in this example. However, for instance, the film thickness of the hydrogen diffusion preventing film 5 may be preferably made from 50 nm to 200 nm, and may be further preferably made from 100 nm to 170 nm.

Formation of the hydrogen diffusion preventing film 5 (step for forming hydrogen diffusion preventing film) may be preferably carried out by, for instance, a reactive sputtering method.

In this case, a reactive sputtering method implies the following technique. That is, while rare gas is introduced into a film forming process chamber in which both a substrate and a sputter target are arranged, a minus high voltage is applied to a sputter electrode (namely, cathode) on which the above-described sputter target is mounted so as to generate plasma discharge, and the target is sputtered by the above-described rare gas plasma. At the same time, while active gas ($N_2$ gas etc.) is introduced into the film forming process chamber, the above-described active gas is reacted with a target material, so that a metal compound thin film is formed on the substrate.

In a case where the hydrogen diffusion preventing film 5 is made of, for example, a tantalum oxide, while a Ta target is employed, both Ar and $O_2$ are introduced into a chamber at a flow rate of 1:1, pressure is maintained at 665 to 2000 mPa, electric power of 1 to 3 kW is supplied by an RF power supply, and plasma is produced in the chamber, so that a tantalum oxide film is formed.

In particular, in order to form the hydrogen diffusion preventing film 5 under amorphous state, or under such a condition that the grain boundaries are wholly distributed, it is preferable to control the temperature of the substrate to become lower than, or equal to 400° C.

Alternatively, while a solution containing Ta is coated on a wafer, this coated wafer may be thermally processed at the temperature of 400° C. for the time duration of 30 minutes in the oxygen atmosphere so as to form the tantalum oxide film.

Figure 3B:
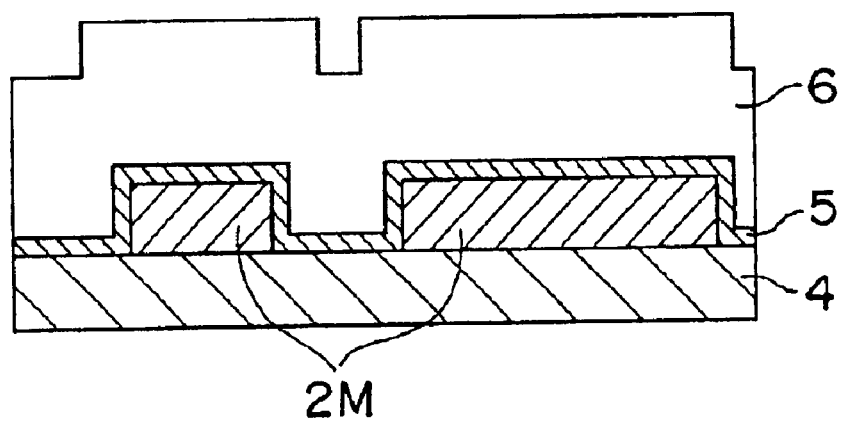

Next, as shown in FIG. 3B, the passivation film 6 is formed. For example, as a film forming method in the case that a silicon nitride film is formed as the passivation film 6, while $SiH_4$, $NH_3$, and $N_2$ are employed as material gas, a temperature of a substrate is selected to be 300° C. to 500° C., and a thickness of this passivation film 6 is made from 200 nm to 100 nm by the P-CVD (Plasma assisted Chemical Vapor Deposition) corresponding to the known method.

Figure 3C:
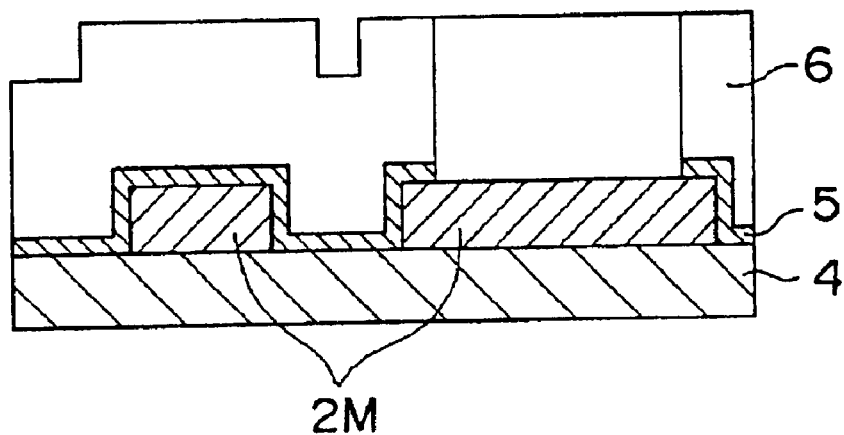

Next, as shown in FIG. 3C, a stacked layer film made of both the hydrogen diffusion preventing film 5 and the passivation film 6 is partially etched so as to be removed. As a result, a portion of the metal wiring 2M is exposed, so that this exposed portion of metal wiring 2M can be electrically in contact with an external device. Thus, a semiconductor device may be completed.

Figure 4A:
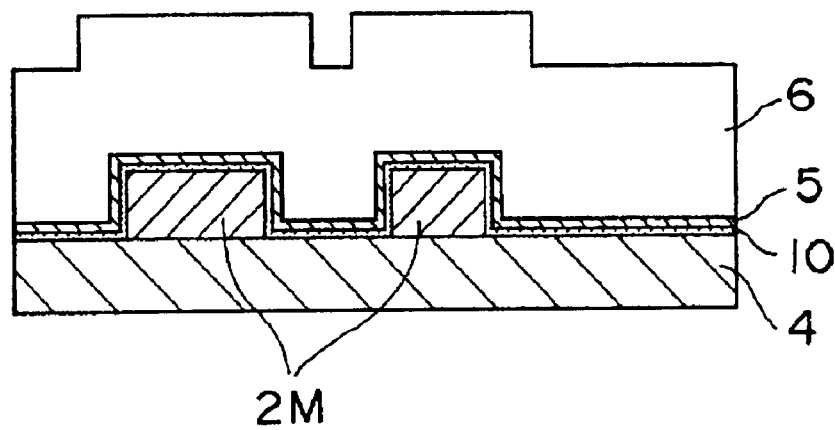
FIG. 4A and FIG. 4B are diagrams for schematically showing an upper portion of another structure of the semiconductor device according to the first example of the present invention.

The above-explained description has described such a structure that after the metal wiring 2M has been formed, the hydrogen diffusion preventing film 5 and the passivation film 6 are stacked. In this structure, an important aspect is such a fact that the hydrogen diffusion preventing film 5 is positioned between the metal wiring 2M and the passivation film 6. As a consequence, as shown in FIG. 4A, even when an insulating film 10 is formed as another film between the metal wiring 2M and the hydrogen diffusion preventing film 5, a similar effect may be apparently achieved. In this alternative case, the following condition is required: That is, the insulating film 10 should be formed under such a condition that both hydrogen produced during formation of the insulating film 10, and an amount of hydrogen captured into this insulating film 10 are set to such levels lower than, or equal to a level at which the device characteristic may be adversely influenced. When this condition may be satisfied, a silicon oxide film, a silicon nitride film, and the like may be used as the insulating film 10.

Figure 4B:
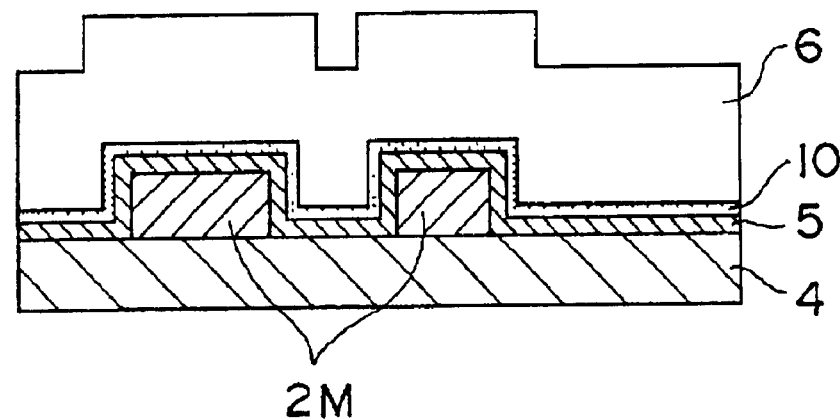

Also, as indicated in FIG. 4B, even when another insulating film is formed between the hydrogen diffusion preventing film 5 and the passivation film 6, a similar effect may be apparently achieved. In this alternative case, even when there is hydrogen during formation of the additionally provided insulating film and also even when there is hydrogen contained in this insulating film, since the diffusion of this hydrogen may be prevented by the hydrogen diffusion preventing film 5, it is possible to avoid the adverse influence on the device which is caused by hydrogen.

Since the entire structure of the semiconductor device is covered by the hydrogen diffusion preventing film, hydrogen $H_2$ never has an adverse influence on a device such as a capacitor located under the hydrogen diffusion preventing film 5, because $H_2$ does not penetrate through the hydrogen diffusion preventing film 5. This $H_2$ would be produced by that the atmospheric gas is degassed, when the silicon nitride film is formed as the passivation film 6, and also the gas contained in the passivation film 6 is degassed.

Figure 5:
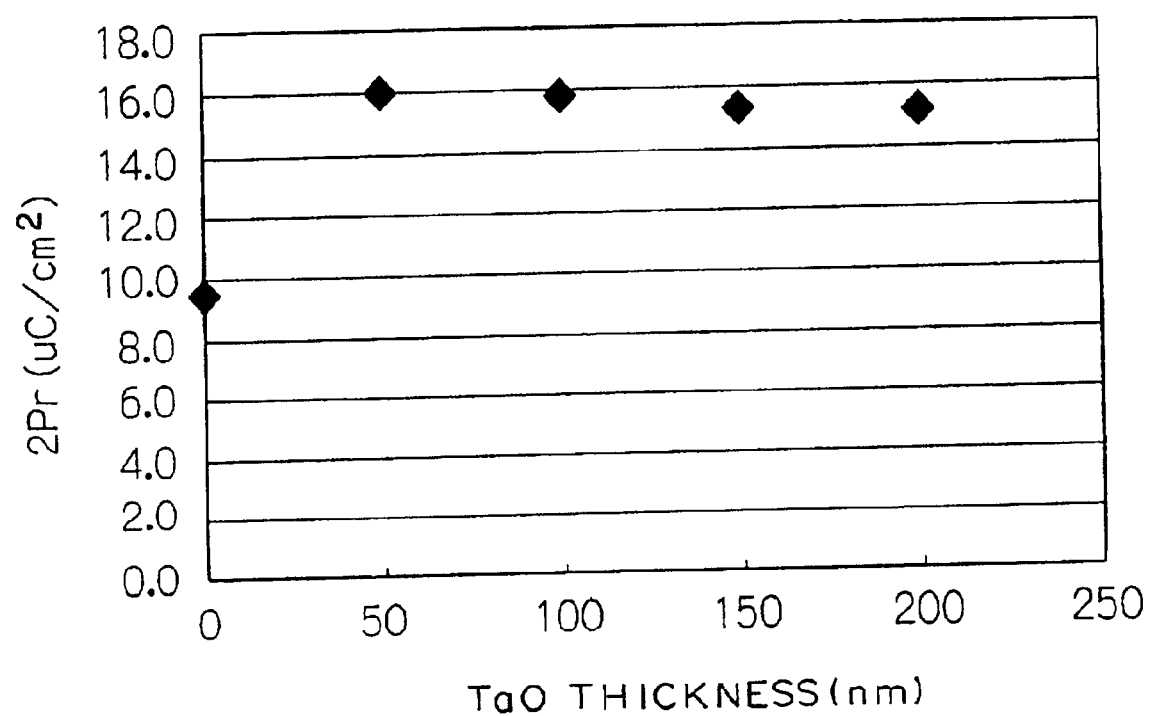
FIG. 5 is a graph representing a thickness dependence characteristic of a hydrogen diffusion preventing film.

FIG. 5 graphically shows a film thickness dependent characteristic of the hydrogen diffusion preventing film 5 in the case that the first example of the present invention is applied to an upper portion of a semiconductor device in which a ferroelectric capacitor is formed.

It should also be noted that a film made of a tantalum oxide was used as the hydrogen diffusion preventing film 5. A silicon nitride film was used as the passivation film 6. An ordinate of this graphic representation indicates a residual polarization value (2Pr) of the ferroelectric capacitor, whereas an abscissa thereof shows a thickness of the tantalum oxide film.

Since the film thickness of the tantalum oxide film is thicker than, or equal to 50 nm, and also the residual polarization value (2Pr) is not lowered, it can be seen that hydrogen derived from the silicon nitride film is cut off.

In general, a diffusion suppressing capability of a diffusion barrier film may be increased under such a condition that there is no grain boundary. This is because the grain boundary may readily constitute a diffusion path of hydrogen. As a result, a tantalum oxide film may effectively function as a diffusion barrier film of $H_2$ under an amorphous condition, or under condition that microcrystal grains are distributed within the film, as compared with another condition that the tantalum oxide film is brought into a perfect crystalline state.

The following fact can be understood from the foregoing result. That is, hydrogen ($H_2$) never passes through the tantalum oxide film (hydrogen diffusion preventing film 5), which hydrogen is produced by degassing the atmospheric gas when the silicon nitride film is formed as the passivation film 6, and by degassing the gas contained in this silicon nitride film. As a consequence, the passivation film 6 may be formed in such a device, the performance of which would be readily deteriorated by hydrogen diffusions produced under the tantalum oxide film.

Also, different from the first example shown in FIG. 2, in a case where the passivation film 6 is formed on the semiconductor device after the metal wiring 2M has been formed, another semiconductor structure may be alternatively formed. That is, the patterned hydrogen diffusion preventing film 5 is employed as an underlayer film of the passivation film 6.

Figure 6:
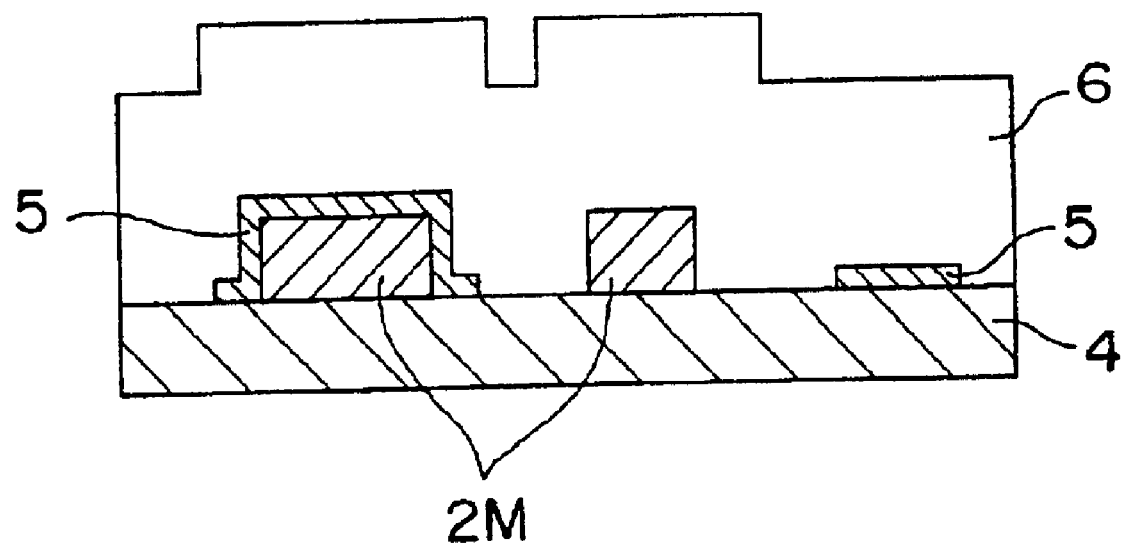
FIG. 6 is a diagram for schematically indicating an upper portion of a semiconductor device according to a second example of the present invention.

FIG. 6 is a sectional view of a semiconductor device for indicating a second example of the present invention. FIG. 6 indicates such a construction defined from the metal wiring 2M of the uppermost layer up to the passivation film 6 in the semiconductor device. A structure of a lower layer lower than the metal wiring 2M of the uppermost layer is similar to that of FIG. 2.

It should be understood that the same reference numerals shown in FIG. 1 and FIG. 2 will be employed as those for denoting the same layers and the same members of FIG. 6 to FIG. 8.

A patterned hydrogen diffusion preventing film 5 is formed on the metal wiring 2M of the uppermost layer, and furthermore, a silicon nitride film is formed as the passivation film 6 on this hydrogen diffusion preventing film 5.

The structural component of the hydrogen diffusion preventing film 5 may be preferably used under amorphous condition or under such a condition that grain boundaries are wholly distributed, or diffused.

The semiconductor device indicated in FIG. 6 may be preferably manufactured in accordance with the below-mentioned fabricating method.

Figure 7A:
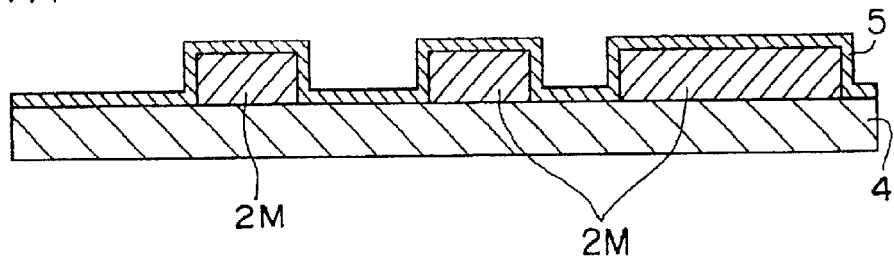
FIG. 7A to FIG. 7D are diagrams for schematically indicating a method for fabricating the semiconductor device according to the second example of the present invention.

First, as shown in FIG. 7A, after the metal wiring layer 2M of the uppermost layer in the semiconductor device has been formed, the hydrogen diffusion preventing film 5 is formed (step for forming hydrogen diffusion preventing film). The thickness of the hydrogen diffusion preventing film 5 is set such that an H$_2$-atmosphere which is used when the passivation film 6 is formed in a later fabricating step, and/or H$_2$-gas which is diffused from the formed passivation film 6 by performing a thermal processing do not reach inside the semiconductor device.

The optimum film thicknesses are different from each other, depending upon the film quality of the hydrogen diffusion preventing film 5, the film forming condition of the passivation film 6, and the thermal processing step after the film formation, so that these optimum film thicknesses cannot be defined in this example. However, for instance, the film thickness of the hydrogen diffusion preventing film 5 may be preferably made from 50 nm to 200 nm, and may be further preferably made from 100 nm to 170 nm similar to the case of FIG. 2.

A method for forming the hydrogen diffusion preventing film 5 (namely, step for forming hydrogen diffusion preventing film) may be preferably carried out by applying the method as explained in FIG. 3.

Figure 7B:
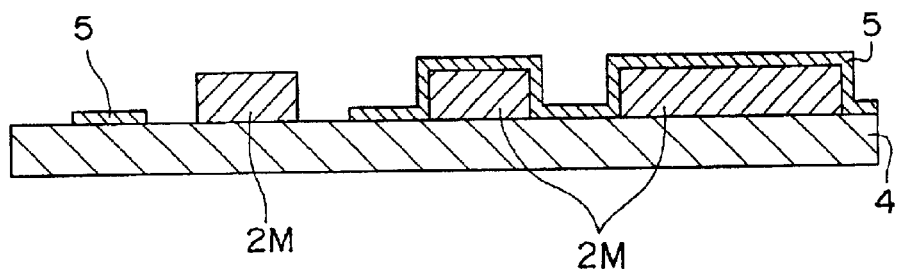

Next, as indicated in FIG. 7B, the hydrogen diffusion preventing film 5 is patterned by a photolithography method and an etching method known in this field. For this etching method, it is preferable to use dry etching with employment of CHF$_3$. As to such a portion in which the hydrogen diffusion preventing film 5 has been removed by the patterning process, hydrogen is diffused in a fabricating step after the passivation film 6 has been subsequently formed, and thus, hydrogen may be supplied to the device located under this portion.

Figure 7C:
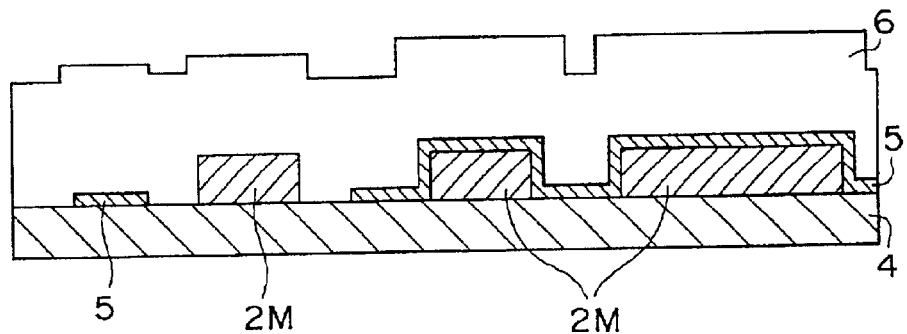

Next, as shown in FIG. 7C, the passivation film 6 is formed. The film forming method may be preferably performed in a similar manner to that of FIG. 3B.

Figure 7D:
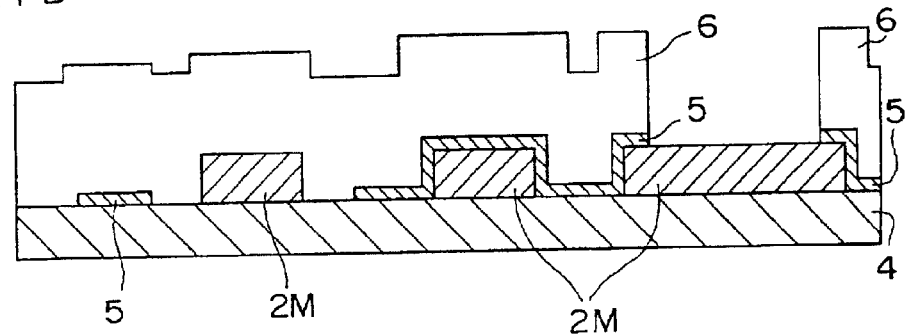

Finally, as shown in FIG. 7D, a stacked layer film made of both the hydrogen diffusion preventing film 5 and the passivation film 6 is partially etched so as to be removed. As a result, a portion of the metal wiring 2M is exposed, so that this exposed metal wiring 2M can be electrically in contact with an external device. Thus, a semiconductor device according to the second example of the present invention may be manufactured.

In the semiconductor structure of the second example of the present invention, both a portion to which hydrogen is supplied and a portion to which hydrogen is not supplied can be realized on the semiconductor chip at the same time.

For instance, in the portion from which the hydrogen diffusion preventing film 5 has been removed, since hydrogen is supplied, hydrogen is supplied to uncoupled bonds of silicon atoms located in the vicinity of a gate oxide film of a general-purpose MOS transistor, and a hydrogen termination process is conducted, so that such a device having a better reproducibility and also an improved characteristic can be realized. On the other hand, in the portion where the hydrogen diffusion preventing film 5 is present, since hydrogen is not diffused downwardly, such materials as a ferroelectric material and a high-K dielectric substance material can be used without deteriorating the characteristics thereof, while these materials are readily reduced by hydrogen.

The below-mentioned description is related to such a structure that the hydrogen diffusion preventing film 5 and the passivation film 6 are stacked after the metal wiring layer 2M has been formed. In this structure, an important aspect is such a fact that in a region where the downward diffusion of hydrogen is not required, the hydrogen diffusion preventing film 5 is positioned between the metal wiring 2M and the passivation film 6.

Figure 8A:
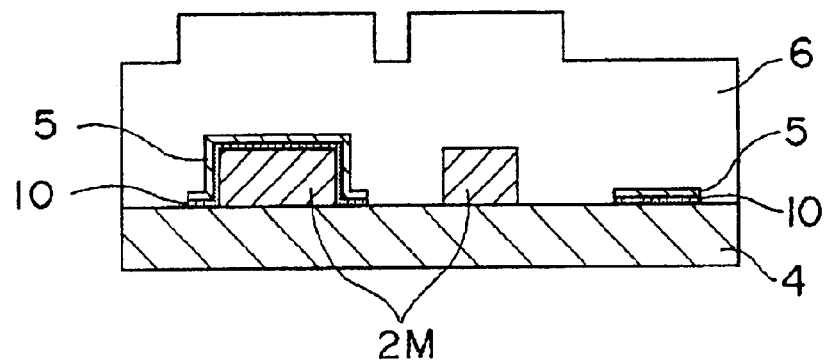
FIG. 8A to FIG. 8C are diagrams for schematically showing an upper portion of other structures of the semiconductor device according to the second example of the present invention.

As a consequence, as shown in FIG. 8A, even when an insulating film 10 is formed as another film between the metal wiring 2M and the hydrogen diffusion preventing film 5, a similar effect may be apparently achieved. In this alternative case, the following condition is required as follows: That is, the added insulating film 10 should be formed under such a condition that both hydrogen produced during formation of the insulating film 10, and an amount of hydrogen captured into this insulating film 10 are set to such levels lower than, or equal to a level at which the device characteristic may be adversely influenced. If this condition can be satisfied, a silicon oxide film, a silicon nitride film, and the like may be used.

Figure 8B:
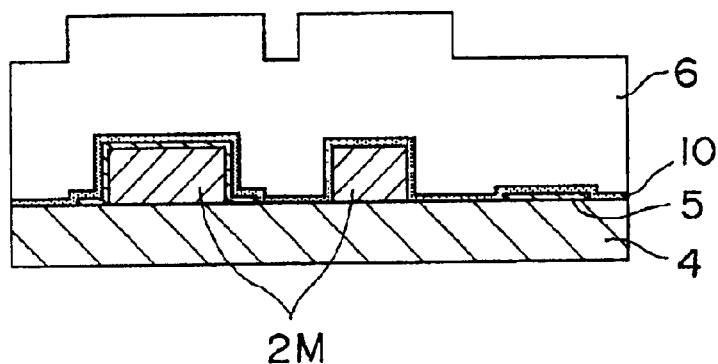
Figure 8C:
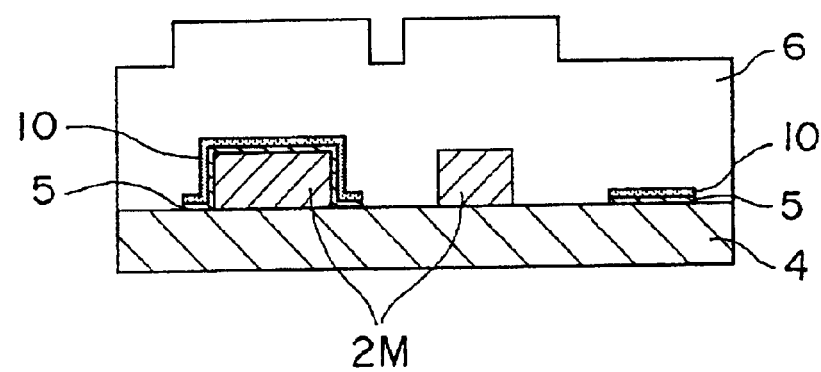

Also, even when another insulating film 10 is formed between the hydrogen diffusion preventing film 5 and the passivation film 6, a similar effect may be apparently achieved. FIG. 8B shows such a case that the insulating film 10 to be added is formed after the hydrogen diffusion preventing film 5 has been patterned. FIG. 8C represents such a case that both the hydrogen diffusion preventing film 5 and the insulating film 10 to be added are processed at the same time. In any case, the downward diffusion of hydrogen can be prevented at the portion where the hydrogen diffusion preventing film 5 is formed.

The semiconductor device corresponding to the second example of the present invention has both regions in which the hydrogen diffusion preventing film 5 is directly made in contact with the metal wiring 2M and regions in which the passivation film 6 is directly made in contact with the metal wiring 2M. In the region which is covered by the hydrogen diffusion preventing film 5, hydrogen (H$_2$) does not pass through the hydrogen diffusion preventing film 5, while this hydrogen is produced by degassing the atmospheric gas used when the passivation film 6 is formed and the gas contained in the film. Also, in the region where the passivation film 6 is directly made in contact with the metal wiring layer, hydrogen (H$_2$) can be diffused downwardly, while this hydrogen is produced by degassing the atmospheric gas used when the passivation film 6 is formed and the gas contained in the film.

In addition, since the hydrogen diffusion preventing film 5 is patterned, both a portion to which hydrogen is supplied and a portion to which hydrogen is not supplied can be realized on the semiconductor chip at the same time. For instance, in the portion from which the hydrogen diffusion preventing film 5 has been removed, since hydrogen is supplied, hydrogen is supplied to uncoupled bonds of silicon atoms located in the vicinity of a gate oxide film of a general-purpose MOS transistor, and a hydrogen termination process operation is conducted, so that such a device having a better reproducibility and also an improved characteristic can be realized. On the other hand, in the portion where the hydrogen diffusion preventing film 5 is present, since hydrogen is not diffused downwardly, such materials as a ferroelectric material and a high-K dielectric substance material can be used without deteriorating the characteristics thereof, even though these materials are readily reduced by hydrogen.

In both the first example and the second example according to the present invention, the structures capable of preventing hydrogen from being diffused in connection with the formation of the passivation film have been explained. Alternatively, hydrogen diffusions occurred in other process operations may be avoided by using the hydrogen diffusion preventing film. For example, when the second example is applied, it is possible to form such a region in which hydrogen is not partially diffused during hydrogen annealing process.

Now, the present invention will be described more in detail with reference to embodiments, but is not limited thereto.

EXAMPLE 1

First, both a transistor and a ferroelectric capacitor were formed on an Si substrate by the known fabricating method, and thereafter, as shown in FIG. 3A, the metal wiring 2M of the uppermost layer of the semiconductor device was formed, and then, the hydrogen diffusion preventing film 5 was formed. The thickness of this hydrogen diffusion preventing film 5 was selected to be 170 nm.

It should also be noted that forming of the hydrogen diffusion preventing film 5 (step for forming hydrogen diffusion preventing film) was carried out by the sputtering method.

As a sputtering condition, the following condition was introduced. That is, while a Ta target is employed, both Ar and $O_2$ are introduced into a chamber at a flow rate of 1:1, pressure is maintained at 1330 mPa (10 mTorr), electric power of 2.5 kW is supplied by an RF power supply, and plasma is produced in the chamber, so that tantalum oxide film is formed.

Next, as indicated in FIG. 3B, the silicon nitride film (passivation film 6) was formed. As a film forming method in the case that the silicon nitride film is formed, while $SiH_4$, $NH_3$, and $N_2$ are employed as material gas, a temperature of a substrate was selected to be 400° C., and a thickness of this silicon nitride film was made as 850 nm by the P-CVD (Plasma assisted Chemical Vapor Deposition) corresponding to the known method.

Next, as shown in FIG. 3C, the stacked layer film made of both the hydrogen diffusion preventing film 5 and the passivation film 6 was partially etched so as to be removed. As a result, a portion of the metal wiring 2M was exposed, so that this exposed portion of metal wiring 2M could be electrically made in contact with an external device. Thus, a semiconductor device (ferroelectric memory) could be manufactured.

COMPARISON EXAMPLE 1

A semiconductor device (ferroelectric memory) was manufactured in a similar fabricating manner to that of the example 1 except that the hydrogen diffusion film was not formed.

While as to the semiconductor device which had been manufactured in the example 1, and the comparison example 1, the evaluations were made based upon electric characteristics of the ferroelectric capacitors. In the comparison example 1, the ferroelectric characteristic of this ferroelectric capacitor was considerably deteriorated, whereas in the example 1, no deterioration could appear in the ferroelectric characteristic of the ferroelectric capacitor before/after the passivation film 6 was formed.

What is claimed is:

1. A method for fabricating a semiconductor device, the method comprising:

providing a semiconductor substrate on whose surface an element is formed;

forming a ferroelectric capacitor on the surface of said semiconductor substrate;

covering said ferroelectric capacitor with a first interlayer film;

forming, in said first interlayer film, a metal layer electrically connected to one of electrodes of said ferroelectric capacitor;

forming a hydrogen diffusion preventing film on said metal layer; and forming a passivation film on said semiconductor substrate after forming said hydrogen diffusion preventing film;

wherein said hydrogen diffusion preventing film comprises tantalum oxide in at least one of an amorphous state and a microcrystalline state which is maintained during and after subsequent thermal processes.

2. The method of claim 1, wherein said passivation film is formed directly on said hydrogen diffusion preventing film.

3. The method of claim 1, further comprising forming at least one other interlayer film on said metal layer before forming said passivation film.

4. The method of claim 1, wherein said hydrogen diffusion preventing film is formed by a reactive sputtering technique using Ar and $O_2$ ions.

5. The method of claim 1, wherein said hydrogen diffusion preventing film is formed in the semiconductor device in a non-reducing atmosphere.

6. The method of claim 1, wherein said element includes a metal-oxide-semiconductor field effect transistor.

7. The method of claim 1, wherein the tantalum oxide is in the microcrystalline state which is maintained during and after subsequent thermal processes.

8. The method of claim 1, wherein the tantalum oxide is prevented from being brought into a perfect crystalline state during and after subsequent thermal processes, so that there are never grain boundaries in the tantalum oxide.

9. A method for fabricating a semiconductor device, the method comprising:

providing a semiconductor substrate on whose surface an element is formed;

forming a ferroelectric capacitor on the surface of said semiconductor substrate;

covering said ferroelectric capacitor with a first interlayer film;

forming, in said first interlayer film, a metal layer electrically connected to one of electrodes of said ferroelectric capacitor;

forming a hydrogen diffusion preventing film on said metal layer;

forming a passivation film on said hydrogen diffusion preventing film; and patterning said hydrogen diffusion preventing film;

wherein said hydrogen diffusion preventing film comprises tantalum oxide in at least one of an amorphous state and a microcrystalline state, which is maintained during and after subsequent thermal processes.

10. The method of claim 9, wherein the step of patterning said hydrogen diffusion preventing film includes patterning said metal layer.

11. The method of claim 9, wherein said passivation film is formed directly on said hydrogen diffusion preventing film.

12. The method of claim 9, further comprising forming at least one other interlayer film on said metal layer before forming said passivation film.

13. The method of claim 9, wherein said hydrogen diffusion preventing film is formed by reactive sputtering technique using Ar and $O_2$ ions.

14. The method of claim 9, wherein said hydrogen diffusion preventing film is formed in the semiconductor device in a non-reducing atmosphere.

15. The method of claim 9, wherein said element includes a metal-oxide-semiconductor field effect transistor.

16. The method of claim 9, further comprising supplying hydrogen to said element after patterning said hydrogen diffusion preventing film.

17. The method of claim 9, wherein the tantalum oxide is in the microcrystalline state which is maintained during and after subsequent thermal processes.

18. The method of claim 9, wherein the tantalum oxide is prevented from being brought into a perfect crystalline state during and after subsequent thermal processes, so that there are never grain boundaries in the tantalum oxide.

* * * * *